Oct. 27, 1970 W. O. SHURTLEFF 3,536,965

METALLIC CONTACT AND INTERCONNECTION SYSTEM FOR SEMICONDUCTOR DEVICES

Filed May 10, 1968 2 Sheets-Sheet 1

WILBURN O. SHURTLEFF

INVENTOR

BY Gerald B. Epstein

ATTORNEY

Oct. 27, 1970 W. O. SHURTLEFF 3,536,965

METALLIC CONTACT AND INTERCONNECTION SYSTEM FOR SEMICONDUCTOR DEVICES

Filed May 10, 1968 2 Sheets-Sheet 2

3,536,965

METALLIC CONTACT AND INTERCONNECTION SYSTEM FOR SEMICONDUCTOR DEVICES

Wilburn O. Shurtleff, Dallas, Tex., assignor to Texas Instruments Incorporated, Dallas, Tex., a corporation of Delaware Filed May 10, 1968, Ser. No. 728,303
Int. Cl. H01l 1/14
U.S. Cl. 317—234 12 Claims

ABSTRACT OF THE DISCLOSURE

Disclosed is an ohmic contact and interconnection system for a semiconductor device where the contact and interconnection includes a rhenium layer and a layer of highly conductive metal, such as gold.

This invention relates to semiconductor devices, and more particularly to metal contacts and interconnections for semiconductor devices such as transistors and integrated circuits.

Electrical contacts to semiconductor devices must be composed of materials which have good chemical, electrical, thermal and mechanical properties when applied to semiconductor surfaces. While problems in making contacts exist for all semiconductors, the selection of contact material is especially difficult when the semiconductor is silicon, such as in planar transistors and integrated circuits where silicon is most commonly used.

In planar semiconductor devices, a silicon oxide or glass coating usually overlies the silicon surface except in the actual contact areas, this coating functioning to passivate the junctions and to provide insulation for expanded contacts and interconnections. Patricularly in integrated circuits, strips of conductive material extend from on semiconductor region up over the oxide coating and across various regions and junctions of the device to contact another region. Accordingly, the contact material must exhibit good adherence to silicon and to silicon oxide or glass, but yet must not produce any undesirable reaction with, nor penetrate, the silicon or silicon oxide.

The most successful techniques thus far devised for the manufacture of semiconductor devices and particularly silicon transistors and integrated circuits rely heavily upon photolithographic techniques to form diffusion masks, define contact areas, etc., and upon RF-sputtering and evaporation to deposit metals and insulating materials. Therefore, to be compatible with the most convenient manufacturing methods, the contact metal selected should permit the use of photomasking and etching, and also should permit RF-sputtering or evaporation as techniques for deposition. These techniques for applying the contact material are most effective when very thin layers are used, and since the other dimensions of the conductor are limited in size by the desired electrical characteristics of the device, the contact material must have high conductivity to prevent the introduction of series resistance.

There is a continuing trend in semiconductor technology to fabricate devices operable at higher frequencies and capable of switching at higher speeds. Of necessity, the physical dimensions of the devices must be made very small to provide these characteristics. For example, the part of a high frequency transistor which functions as the emitter region may occupy one-tenth square mil or less on the face of a semiconductor wafer, and may be only a few hundredth of a mil in depth. Connection cannot be made directly to such a region with a bonded wire, so the contact area must be expanded out over a covering silicon oxide to make room for attaching an external lead, requiring the contact metal to be unreactive with the silicon oxide layer. In transistors of this type, the silicon oxide layer overlying the base region is very thin because of the short time during which the device can be held at temperatures which promote oxide growth. Typically, this oxide layer is less than 2,000 A., compared to almost 10,000 A. over the collector region. Therefore, degradation of the device due to penetration of the contact metal through the silicon oxide to the junctions underneath would be particularly severe in high frequency devices. Also, the contact metal must not tend to penetrate into the semiconductor surface at the contact area since very slight penetration would tend to degrade the device.

The contact metal should not form an alloy with the semiconductor material at temperatures used in bonding leads to, or packaging, the device. Formation of such an alloy would result in the undesirable penetration of the contact metal into shallow semiconductor regions. This limitation lessens the attractiveness of using aluminum in direct contact with silicon because of its low eutectic temperature with silicon, 577° C., a temperature often exceeding in depositing contact metals, in bonding or in hermetically sealing the device. In like manner, the contact metal should not have a melting point below that temperature to which the device would be exposed in subsequent processing and operation.

An additional requirement for a contact metal is that it should provide an ohmic and low resistance contact to the semiconductor surface. If the device is made of silicon, particular problems occur because of the inherent properties of the material, the propensity of this semiconductor for forming an oxide, for example. Moreover, if the contact metal used is a donor or acceptor in the semiconductor, it must have sufficiently low solubility so that the tendency to form a junction can be thwarted by heavy doping of the contact area.

With these limitations, most metals are totally unsuited for use alone as expanded contacts to silicon devices. For example, the best conductors, silver, copper and gold, do not adhere well to silicon oxide, and in addition gold forms a eutectic with silicon at low temperatures, degrading device characteristics. Also, silver oxidizes rapidly so a bond cannot be made easily, while copper diffuses very rapidly in silicon. Examining the other metals, it will be noted that rhodium and iridium do not adhere to silicon oxide and are not readily etched. Zinc has a low melting point, does not adhere to silicon oxide, and has an undesirably high vapor pressure. Cobalt is difficult to evaporate. Nickel does not adhere well to silicon oxide and is difficult to bond with gold wire. Iron cannot be readily bonded. Platinum and palladium adhere poorly to silicon oxide, and are difficult to be bonded with gold wire. Tin has a very low melting point. Chromium cannot be readily etched or bonded with gold wire, is too porous and unduly reactive with silicon oxide. Tantalum is even more difficult to etch and bond and is even more reactive with silicon oxide than chromium. Lead exhibits por adherence to silicon oxide. Vanadium, zirconium and titanium are very poor conductors, react with silicon oxide, and are virtually impossible to bond with gold wire, while the latter two suffer the additional disadvantage of being difficult to etch. Indium has a very low melting point. Antimony, arsenic, and gallium are doping impurities with high solubilities and/or diffusion rates in silicon, while gallium melts at slightly above room temperature.

The only single metal which is at all suitable for contacts and interconnections in silicon planar transistors and integrated circuits is aluminum, which has been used widely for such purposes. Aluminum thin films of excellent quality are easily applied to semiconductor devices by evaporation and photoresist techniques, and contacts of this metal are readily bondable with gold or aluminum wires. Aluminum is the fourth best conductor, and its adherence to silicon and silicon oxide is possibly unsurpassed. The adherence to silicon oxide is probably caused by a chemical reaction, expressed by the formula, $$3SiO_2+4Al \rightarrow 2Al_2O_3+3Si$$

which is very energetically favorable, the free energy of formation under standard conditions, Δ° F., being −184 kcal./mole for this reaction. For aluminum the Δ° F. for oxide formation is about −376, whereas for silicon it is −192, the difference providing the −184 figure. The excellent adherence of aluminum to silicon oxide is due to this reaction. Presumably, aluminum films applied to silicon oxide surfaces are held firmly due to an interfacial reaction of this type.

Nevertheless, despite its several advantages for use as a contact material in semiconductor devices, aluminum has a number of disadvantages. Aluminum at high electrical potentials and operating temperatures tends to form a "purple plague" due to a gold-aluminum reaction which causes the contacts to electrically open when gold connecting wires are used to connect the aluminum interconnections to the package. Also aluminum is second only to sodium in its reactivity to moisture and other elements.

Attempts to find a single metal or alloy as a substitute for aluminum have not been entirely successful. Thus, it becomes necessary to employ a multilayered or sandwich type contact. For example, chromium and gold have been proposed as a contact, in which case a thin layer of chromium is applied first and then a layer of gold is deposited over the chromium. Unfortunately, chromium exhibits relatively poor electrical contact to silicon, and is not itself a very good conductor. In addition, chromium does not prevent the penetration of gold into the silicon, and in fact this penetration is used to promote lower contact resistance, the chromium-gold layers being sintered after deposition. Also, chromium is subjected to severe undercutting during etching in the photolithographing process, since chromium is difficult to etch in a slow, controlled manner.

Multilayer contacts made from molybdenum and gold have found widespread use in the fabrication of integrated circuits. The molybdenum is used to adhere to the silicon and silicon oxide surfaces while gold is used to carry the bulk of the current and to protect the molybdenum on a single device or as the final interconnection of an integrated circuit. Molybdenum, however, has a number of disadvantages when used in a contact system. Molybdenum oxidizes readily at low temperatures and corrodes quite readily in wet environments. Molybdenum also reacts with any impurity elements present in a silicon oxide and transcends from a ductile to a brittle state in the operating temperature range of semiconductor production, from +400° C. to −55° C., for example. The above mentioned disadvantageous characteristics result in and are responsible for peeling of the leads from the wafer undercutting of the leads during etching of the leads and the formation of resistive contacts in the contact windows in the silicon oxide.

Another possible multilayer combination is tungsten and gold. However, tungsten also is in a brittle state over the operating range of most semiconductor devices. Tungsten is hard to etch and is attached by many of the chemical etches used to etch silicon. Tungsten also oxidizes at low temperatures and will tend to corrode in wet environments.

With the difficulties mentioned above in mind, it is an object of the invention to provide an improved contact and interconnection system for semiconductor devices, particularly silicon devices, such as transistors, integrated circuits of a type having silicon oxide coatings thereon.

More specifically, an object of the invention is an improved contact and interconnection system using materials which do not tend to degrade semiconductor devices by their presence, which lend themselves to manufacturing techniques compatible with other processes used on the devices and which permit working with very small geometries.

Another object of the invention is an improved contact and interconnection system that does not oxidize at device fabrication temperatures.

A further object of the invention is an improved contact and interconnection system which is very corrosion resistant.

A still further object of the invention is an improved contact and interconnection system which does not go from the ductile to the brittle state in the operating range of most semiconductor devices.

Yet another object of the invention is an improved contact and interconnection system that does not react with any impurities in the underlying insulating layer.

In accordance with the above stated objectives of the invention, a combination of metals almost uniquely commensurate with the above objectives is found to be rhenium and a high conductivity metal, such as gold. A thin layer of rhenium is first applied to the surface of the semiconductor device, typically over the entire face of a silicon wafer having a silicon oxide coating with openings etched in contact areas. The rhenium is covered with a thin layer of gold, and thereafter the gold and rhenium are etched away in unwanted areas, leaving the desired pattern of contacts and interconnections on the silicon surface and on the oxide layer. Gold is used as the top layer because it has excellent electrical conductivity and resistance to oxidation and corrosion. Moreover, gold lends itself nicely to photoresist etch procedures, producing no deleterious effects at the contact-to-wire interface. The underlying rhenium layer is necessary to prevent gold from alloying with or penetrating the silicon, and to bond the contact to the silicon and silicon oxide surfaces.

Rhenium is particularly well suited for this environment because it adheres well to silicon and silicon oxide, can be etched in a controlled manner with an etchant not incompatible with other materials present, and does not alloy with and is virtually impervious to gold. Rhenium makes good electrical contact to silicon if the contact region is heavily doped, preferably above about $10^{21}$ per cc. for either N- or P-type, but does not form an alloy with the silicon surface so that shallow junctions are not degraded. In this regard, it might be noted that a virtually "alloyless" contact is formed, the rhenium not alloying with the silicon and the gold not alloying with the rhenium. Other advantages of rhenium over tungsten and molybdenum are as follows: rhenium does not really oxidize at temperatures below 550° C. whereas molybdenum oxidizes readily at 25° C. and tungsten oxidizes above 300° C. Rhenium is more corrosion resistant to most acids, other than nitric acid. Rhenium is not reactive with silicon dioxide or elemental impurities (boron, phosphorus, antimony, for example) normally found in semiconductor oxides whereas tungsten and molybdenum tend to pick up such impurities. Although no data are shown in the literature on pure rhenium, the ductile to brittle transition of binary alloys with rhenium approaches absolute zero with increasing percentages of rhenium, as shown by R. I. Jaffee, D. J. Maykuth and R. W. Douglass: Refractory Metals and Alloys, Interscience Publishers, Inc., New York, 1961, pp. 316–334. The tensile strength of rhenium is about three times higher than that of molybdenum and two times that of tungsten over the operating range of most semiconductors. Rhenium's resistance to the "water cycle" of vacuum tubes is approximately 200 times greater than tungsten which indicates that the resistance to electrolytic corrosion of rhenium in the presence of moisture is greater than that of tungsten.

The novel features believed characteristic of this invention are set forth in the appended claims. The invention itself, however, as well as other objects and advantages thereof, may best be understood by reference to the following detailed description of the illustrative embodiment, read in conjunction with the accompanying drawings, wherein:

Figure 1:
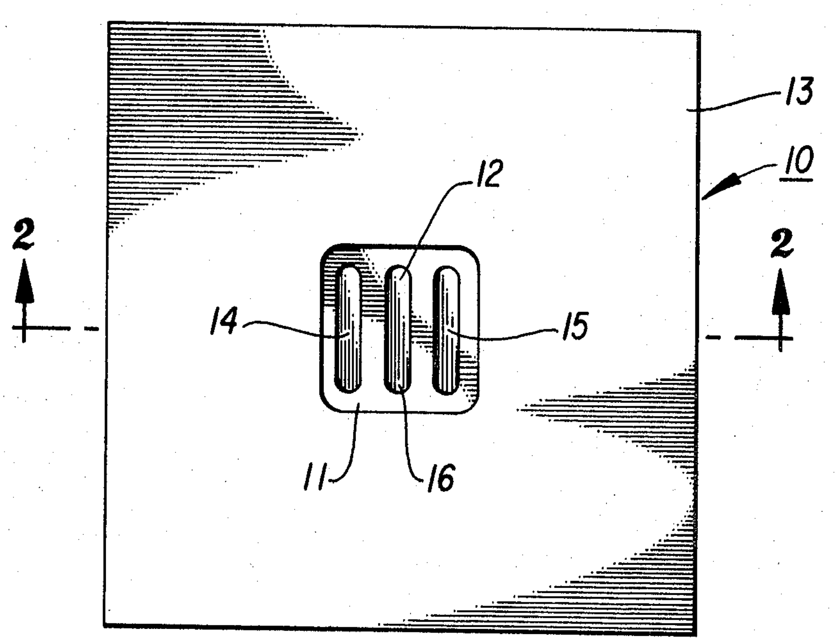
FIG. 1 is a plan view of a wafer of semiconductor material having a planar transistor formed therein, with holes cut in the oxide coating for application of contacts.
Figure 2:
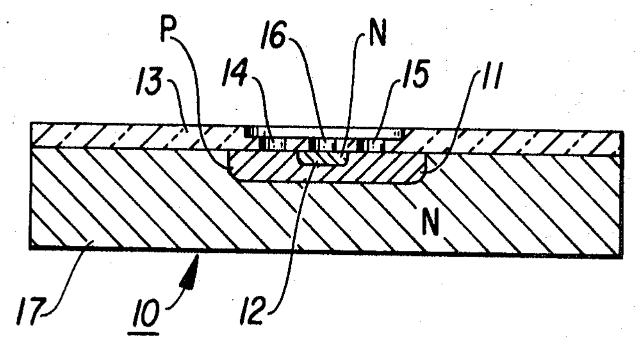
FIG. 2 is a sectional view of the semiconductor wafer of FIG. 1 taken along the line 2—2.

Referring now to the figures, in FIGS. 1 and 2, there is shown a semiconductor wafer 10 having a transistor formed therein including base and emitter regions 11 and 12, respectively, the remainder of the wafer providing the collector region 17. The transistor is formed by the planar technique, using successive diffusions with silicon oxide masking. The conventional semiconductor fabrication methods used in the planar technique are so well known in the art that they will not be detailed here. For complete descriptions of such methods, see any of the following:

Integrated Circuits-Design Principles and Fabrication, Ray M. Warner, Jr., and James Fardemwalt, McGraw-Hill (1965); Silicon Semiconductor Technology, McGraw-Hill (1965); or Physics and Technology of Semiconductor Devices, A. S. Grove, Wiley & Sons (1967).

An oxide coating 13 is formed on the top surface of the wafer by any conventional method. For high frequencies, the geometry of the active parts of the transistor is extremely small, the elongated emitter region 12 being perhaps 0.1 to 0.2 mil (0.002 inch) wide and less than a mil long. The base region 11 is about 1 mil square. A pair of openings 14 and 15 are provided for the base contacts, and an opening 16 for the emitter diffusion. Due to the extremely small size of the actual base and emitter contact areas, one- or two-tenths of a mil in width, the contacts must be expanded out over the silicon oxide to facilitate bonding of leads for the base and emitter connections, as will be explained below. The bulk of the wafer 10 forms a collector region 17; the collector contact may be applied to the lower face of the wafer. The size of the semiconductor wafer is selected for convenience in handling, with a typical size for the wafer 10 being 30 mils on each side and 4 mils thick (these dimensions are not to scale in the drawing). Typically, the wafer 10 is merely a small undivided part of a large slice of silicon. perhaps 1 inch in diameter and 8 mils thick, during all of the process steps described below, and this slice is scribed and broken into individual wafers or dice only after the contacts are applied.

A rhenium layer 21 is deposited on the surface of the silicon oxide coating 13 and on the surface of the wafer 10 exposed by the openings 14, 15 and 16 by any of the conventional methods used in the semiconductor industry, such as evaporation or RF-sputtering. A gold layer 22 is then deposited on the surface of the rhenium layer 21, preferably by the same apparatus used to deposit the rhenium. An intermediate material may be applied to the bare silicon of the wafer 10 for the purpose of stopping the formation of silicon oxide, a cause of high ohmic contacts. Such an addition, for example, might include the deposition of platinum to the surface of the silicon and the sintering of the platinum into the surface of the bare silicon to form platinum silicide prior to the deposition of the rhenium layer 21, thus impeding the formation of silicon oxide in the contact opening or window. The rhenium layer would then make contact in the window to the platinum silicide rather than to the bare silicon.

After removing the slices from the deposition chamber, the excess portions of the rhenium-gold layers 21 and

22, respectively, are removed by subjecting the silicon slices to a selective photoresist masking and etching treatment. A thin coating of a photoresist polymer, Eastman Kodak KMER for example, is applied to the entire top surface of the gold layer 22. The photoresist is exposed to ultraviolet light through a mask which allows light to reach the areas where the rhenium-gold layer is to remain. The unexposed photoresist is then removed by developing in a photodeveloping solution.

The slice is now subjected to successive etching solutions to remove the unwanted portions of the gold and rhenium layers. A suitable etch solution for gold is an alcoholic potassium iodine solution. After the unmasked gold is etched away, the exposed rhenium is removed by an etchant such as nitric acid, for example. The photoresist mask which has remained intact through these two etching steps is now removed by rinsing in a solvent such as methylene chloride.

Figure 3:
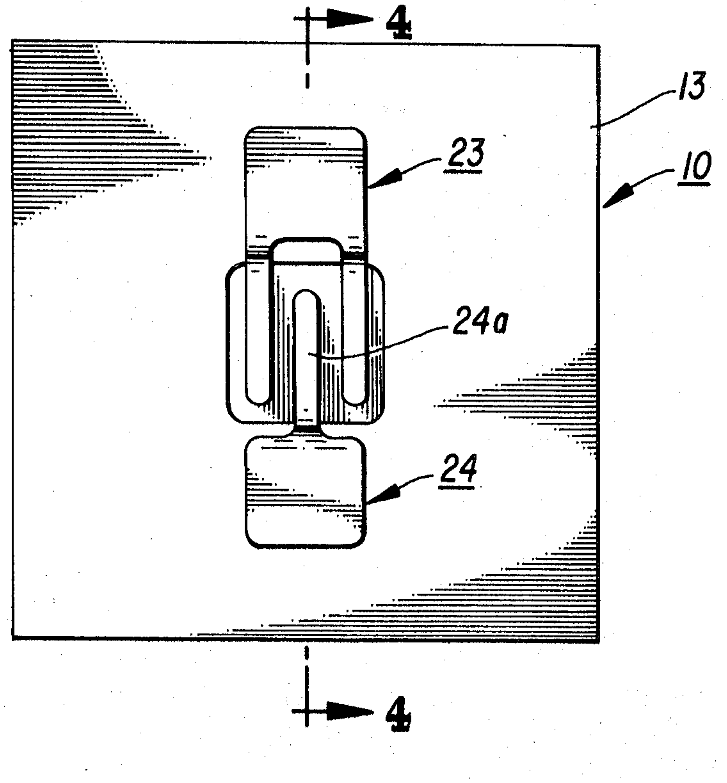
FIG. 3 is a plan view, illustrating the wafer shown in FIG. 1 after the contacts and bonding pads have been applied.
Figure 4:
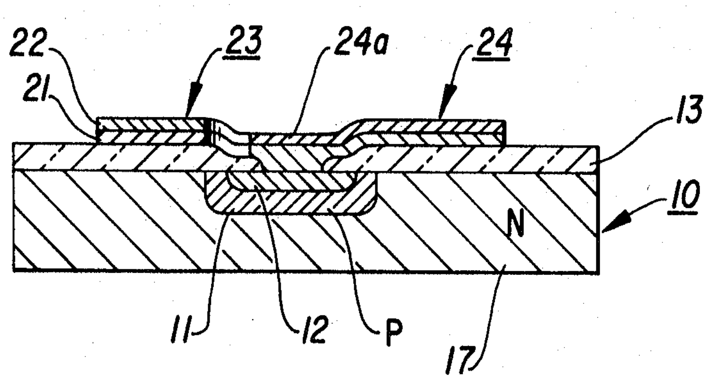
FIG. 4 is a sectional view of the wafer shown in FIG. 3, taken along the line 4—4.

Following the definition of the rhenium-gold contacts, the slices are scribed on the top face, and then broken into individual chips or wafers 10. Each wafer will have a contact pattern as seen in FIGS. 3 and 4. A base contact land or bonding pad 23 is provided on top of the oxide, and two fingers or strips extend over the base-collector junction into the base contact holes 14 and 15 (FIG. 2). Likewise, an emitter contact land 24 or bonding pad is provided, and a single strip **24*a* extends over to make the emitter contact in the hole 16 (FIG. 2). The fingers or strips are very narrow, about one- or two-tenths of a mil or less, and so excellent definition or resolution is absolutely necessary. The pads 23 and 24** are large enough to permit bonding of 0.7 to 1 mil wires thereto.

To provide good, low resistance, ohmic contacts to silicon with rhenium, it is necessary that the surface regions of the silicon where contact is made be of high impurity concentration, whether N-type or P-type. When boron or phosphorus is used as the impurity the surface concentration for good contact should be greater than $2\times10^{19}$ atoms per cc., and preferably above $10^{21}$. Electrical contact can be made to silicon surfaces that contain lesser concentrations, but the contact resistance increases as the dopant concentration decreases. In typical transistors such as that described above, the N-type emitter is ordinarily of very high concentration, especially at the surface, since this is the second diffusion. Even though generally of lower concentration than the emitter, the base region is also ordinarily doped heavily enough, at the surface at least, to provide low resistance contact. If not, a shallow P-type diffusion step is introduced prior to deposition of the contact materials. This diffusion would be through openings of about the same size and in the same place as the openings 14 and 15 formed for the base contacts, and preferably the exact same openings are used.

In integrated circuits the extra diffusions to produce high surface concentrations in the contact areas are more likely to be necessary. This is because the collector contact is made on top of the wafer to a region which may be an epitaxial layer of low concentration or else may be the first diffusion in a triple diffused device, this first diffusion generally being of fairly low concentration so that the two subsequent diffusions may be made. Also, the base region of the transistor of an integrated circuit is ordinarily made simultaneously with the formation of a diffused resistor. Since the resistivity of the material which forms this diffused resistor region should be fairly high, this requires the base concentration to be fairly low. Accordingly, in a typical integrated circuit with NPN transistors and P-type diffused resistors, the impurity concentration for contacts to the collectors, bases and resistors must be supplemented for contact purposes. The necessity for the heavily doped contact region can be eliminated in some cases with a flash or a very thin layer of aluminum applied before the contact material is deposited. Since aluminum is P-type itself, no additional doping is necessary to provide the high surface concentration in P-type regions.

Figure 5:
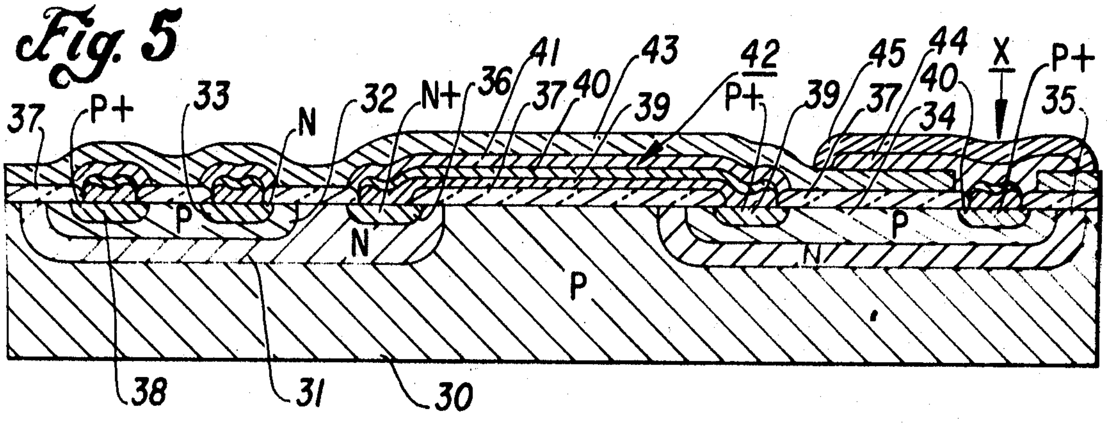
FIG. 5 is a sectional view of a wafer, illustrating an integrated circuit having two levels of metal interconnections.

An integrated circuit is shown, in section, in FIG. 5, which comprises a P-type silicon wafer 30 having a transistor formed on the left-hand end having a diffused N-type collector region 31, a P-type base region 32, and an N-type emitter region 33. On the right-hand side, a resistor is provided by a P-type diffused region 34 formed in an isolation region 35. Before the second N-type diffusion, which forms the emitter region 33, an opening is formed in the insulating layer 37 of silicon oxide, for example, where the collector contact is to be made by conventional photolithographic and etch methods and a high concentration N+type region 36 is created simultaneously with the emitter region 33. Then high concentration P+type regions 38, 39 and 40 are produced by a subsequent selective boron diffusion using the silicon oxide layer 37 as a mask. Thereafter openings are formed in the oxide layer 37 where the transistor contacts and the resistor contacts are to be made. By successive depositions using conventional metal deposition methods, such as evaporation or RF-sputtering, for example, a multilayer comprising a bottom rhenium layer 39, an intermediate gold layer or copper layer 40 and a top rhenium layer 41 are formed on the top surface of the device; the metal layers are then selectively removed using the photolithographic and etch techniques previously described to produce the desired pattern of multilayer contacts and interconnections. (A copper etchant, such as a solution of 15 parts of $FeCl_3$, 30 parts of HCl and 200 parts of $H_2O$, would be required for copper, of course.) It is seen that the collector region 31 is connected to one end of the resistor 34 by a multilayer interconnection 42 which extends over the oxide.

To form the second level of interconnections a second layer 43 of insulating material, silicon oxide, for example, is formed over the entire top surface of the integrated circuit and openings are formed by photolithographic and etching methods to expose portions of the lower level of interconnections as indicated at point X. The layer 41 of rhenium is also removed in the opening to expose the gold layer 40 and to decrease interlevel contact resistance. A rhenium layer 44 is deposited on the top surface of the integrated circuit and a gold layer 45 is deposited on the rhenium layer 44. Both layers are etched, as previously described, to define the second level interconnections, such as the one shown at point X. Although only one transistor and one resistor are shown, the typical integrated circuit includes in the same semiconductor wafer many other circuit components, such as transistors and resistors, of the type seen in FIG. 5. Of course, the heavily-doped regions under the contacts could be used in the transistor shown in FIG. 4. Although not given numerical designations, the contacts to the regions 38 and 33 are also multilayered as was the multilayer interconnector 42.

While the invention has been described with reference to specific methods and embodiments, it is to be understood that this description is not to be construed in a limiting sense. Various modifications of the disclosed embodiments, as well as other embodiments of the invention, may become apparent to persons skilled in the art without departing from the spirit and scope of the invention as defined by the appended claims.

What is claimed is:

1. An electrical connection system for an integrated circuit having a plurality of circuit components formed adjacent one surface of a substrate and an insulating layer on said one surface having a plurality of openings exposing portions of said circuit components, said system comprising:

multilayer interconnections on said insulating layer electrically connecting certain portions of said circuit components through said openings in said insulating layer, another insulating layer on said multilayer interconnections having a plurality of openings exposing portions of said multilayer interconnections, electrical interconnections on said another insulating layer electrically connecting certain portions of said multilayer interconnections, said multilayer interconnections having a lower layer comprised of rhenium, an intermediate high-conductivity metal layer and an upper layer comprised of rhenium.

2. The electrical connection system as defined in claim 1, wherein said electrical interconnections include a lower layer comprised of rhenium and an upper high conductivity metal layer.

3. The electrical connection system as defined in claim 1, wherein said high conductivity metal layer is comprised of gold.

4. The electrical connection system as defined in claim 1, including a layer of metal intermediate said multilayer interconnections and said certain portions of said circuit components.

5. An electrical connection system for an integrated circuit having a plurality of circuit components formed adjacent one surface of a semiconductor substrate, a first insulating layer on said one surface having openings exposing portions of said circuit components, said system comprising:

first multilayer interconnections on and adherent to said first insulating layer ohmically connecting and electrically interconnecting certain portions of said circuit components through said openings in said first insulating layer, a second insulating layer on and adherent to said first multilayer interconnections having openings exposing portions of said first multilayer interconnections, second multilayer interconnections on and adherent to said second insulating layer ohmically engaging and electrically interconnecting the exposed portions of said first multilayer interconnections, said first multilayer interconnections including a lower layer comprised of rhenium, an intermediate high conductivity metal layer and an upper layer comprised of rhenium.

6. An electrical connection system as defined in claim 5 wherein said second multilayer interconnections include a lower layer comprised of rhenium and an upper high conductivity metal layer.

7. An electrical connection system as defined in claim 5 wherein said high conductivity metal layer is gold.

8. A semiconductor device comprising a metallic layer ohmically contacting a semiconductor surface portion of said semiconductor device, said metallic layer comprising rhenium.

9. A semiconductor device as defined in claim 8, including a high conductivity metal layer on at least a portion of said layer comprised of rhenium.

10. A semiconductor device as defined in claim 9, wherein said high conductivity layer is gold.

11. A semiconductor device comprising a semiconductor substrate having first and second zones of opposite conductivity types forming a P-N junction therebetween terminating at one surface of said substrate beneath an insulating layer on said one surface, said insulating layer defining an opening therein exposing a portion of said first zone, a layer comprised of rhenium on and adherent to said insulating layer and ohmically connecting to the exposed portion of said first zone.

12. A semiconductor device according to claim 11, including a high conductivity metal layer on at least a portion of said layer comprised of rhenium.

References Cited

UNITED STATES PATENTS 3,290,570 12/1966 Cunningham et al. ---- 317—240

JOHN W. HUCKERT, Primary Examiner

R. F. POLLISACK, Assistant Examiner

U.S. Cl. X.R.

317—235